United States Patent [19]
Yoon et al.

[11] Patent Number: 5,579,276
[45] Date of Patent: Nov. 26, 1996

[54] INTERNAL VOLTAGE BOOSTING CIRCUIT IN A SEMICONDUCTOR MEMORY DEVICE

[75] Inventors: Sei-Seung Yoon, Seoul; Byung-Chul Kim, Kyungki-do, both of Rep. of Korea

[73] Assignee: Samsung Electronics Co., Ltd., Suwon, Rep. of Korea

[21] Appl. No.: 542,965

[22] Filed: Oct. 13, 1995

[30] Foreign Application Priority Data

Oct. 13, 1994 [KR] Rep. of Korea ............. 26238/1994

[51] Int. Cl.[6] .................................................. G11C 7/00
[52] U.S. Cl. .......................... 365/226; 365/203; 365/204
[58] Field of Search ................................. 365/226, 203, 365/204

[56] References Cited

U.S. PATENT DOCUMENTS 5,426,333  6/1995  Maeda ............................ 365/203
5,511,026  4/1996  Cleveland et al. ............... 365/226

*Primary Examiner*—David C. Nelms
*Assistant Examiner*—Trong Phan
*Attorney, Agent, or Firm*—Cushman Darby & Cushman, L.L.P.

[57] ABSTRACT

The voltage boosting circuit of the present invention includes a voltage converting circuit connected between an oscillator and a pair of pumping capacitors. The pair of pumping capacitors are then connected to a single transmission transistor, which outputs a boosted voltage that is derived from the combination of a precharge voltage placed on the source of the transmission transistor and the voltage stored on the pumping capacitors. The presence of the voltage converting circuit, which uses cross-connected PMOS transistors coupled to ground through a pair of NMOS transistors and establishes a differential amplifier, substantially eliminates the body effect problems that would otherwise occur.

8 Claims, 4 Drawing Sheets

5,579,276

1

INTERNAL VOLTAGE BOOSTING CIRCUIT IN A SEMICONDUCTOR MEMORY DEVICE

BACKGROUND OF THE INVENTION

1. Field of the Invention

The present invention relates to a semiconductor memory device and more particularly to a boosting circuit for boosting an internal voltage.

2. Description of the Related Art

Generally, a semiconductor memory device such as dynamic random access memory (DRAM) functions to move an effective potential. The potential in a DRAM constructed using CMOS transistor technology experiences a voltage drop of somewhat more than a threshold voltage of a MOS transistor in the process of being transmitted through the channel region of the MOS transistor. Such voltage drops potentially cause information losses as well as acting as inhibiting accurately performing data reading and writing operations.

The continuing increases in the density and capacity of semiconductor memory devices have caused a commensurate increase of power consumption. For this reason, the semiconductor memory devices use an internal voltage source to lower the power consumption and to enhance the reliability of operation thereof.

In order to correctly read/write data from/to a memory cell composed of a MOS transistor and a capacitor, a voltage sufficient to overcome the threshold voltage of the MOS transistor should be provided. Thus, for example, a voltage boosted by 1.5 V compared to the internal voltage is typically provided to the word line that becomes the gate of the MOS transistor.

FIG. 1 is a diagram showing an internal voltage boosting circuit according to a prior art. The internal voltage boosting circuit of FIG. 1 includes an oscillator 8 for outputting an output signal of internal voltage IVC level, pumping capacitors 2 and 4 receiving the output of the oscillator 8 at their one ends and pumping nodes A and B respectively connected to their other ends. and a transmission transistor 6 having its drain connected to the pumping node A, its gate connected to the pumping node B and its source outputting a boosted voltage VPP. A precharging circuit (not shown) for precharging the pumping nodes A and B to a predefined voltage level is also included in the circuitry In operation, upon power-up of a chip or the beginning of an active cycle, the oscillator 8 starts to oscillate whenever the boosted voltage VPP falls below a prescribed voltage level. The pumping capacitors 2 and 4 are thus pumped by the output of IVC level output from the oscillator 8. The voltage that the pumping node A is charged to is applied via the channel of the transmission transistor 6 as the boosted voltage VPP. However, when using a lower internal voltage in an effort to reduce power consumption as has become the recent trend, it is impossible to raise the boosted voltage VPP to the desired voltage level. The reason is that even after precharging the pumping nodes A and B by a predetermined voltage and then pumping the voltage, the pumping nodes A and B cannot be boosted enough due to the lower pumping voltage and the fact that the boosted voltage VPP is reduced by the threshold voltage of the transmission transistor 6.

Specifically, when the pumping nodes A and B are precharged by the internal voltage IVC and pumped by the IVC level output from oscillator 8, the pumping nodes A and B

2 are raised to a 2IVC level. The boosted voltage VPP will then be 2IVC−Vth (wherein Vth represents a threshold voltage of the transmission transistor 6). However, though the boosted voltage VPP level increases, there also occurs a voltage drop greater than the threshold voltage Vth due to the body effect (also called substrate bias effect) of the transmission transistor 6. If a low internal voltage IVC is used to avoid such a voltage drop, it is difficult for the boosted voltage VPP to reach the desired boosted voltage level of IVC+1.5 V and, even if it does, stable operation of the chip can not be ensured due to the deterioration of the driving capability.

When the pumping nodes A and B are precharged by a power supply voltage VCC and then pumped by the output of IVC level from the oscillator 8 the above mentioned difficulty appears. For example, assuming that the external voltage is 2.8 V, the internal voltage IVC is 2 V, and the pumping efficiency is 100%, the pumping nodes A and B will be boosted to 4.8 V. However, although the boosted voltage VPP should be above 3.5 V as described above (2.0+1.5), the gate-source voltage Vgs of the transmission transistor 6 falls below 1.3 V. Thus, even though the transistor 6 is turned on, it is impossible to obtain a stable boosted voltage VPP due to the reduction of the driving capability thereof.

The boosting circuit having the construction as shown in FIG. 1 is fabricated in accordance with a typical CMOS manufacturing process. Thus, an NMOS transistor fabricated this the CMOS manufacturing process is used for the transmission transistor 6. Due to this construction, the circuit of FIG. 1 has a pumping efficiency problem, since it is well known in the art that an increase in the voltage level applied to the source and drain of the MOS transistor causes an increase in the body effect thereof. Further still, the increase in the density of semiconductor memory devices results in the miniaturization of circuit elements and results in smaller intervals between circuit elements, which further exacerbates the body effect problem. Accordingly, the boosting circuit of FIG. 1 has a problem of low pumping efficiency. In addition, even though it is possible to obtain the boosted voltage of desired level, the reliability of the chip operation can not be ensured due to the deterioration of driving capability of the transmission transistor.

SUMMARY OF THE INVENTION

It is therefore an object of the present invention to provide an internal voltage boosting circuit of a semiconductor memory device capable of enhancing the pumping efficiency thereof.

It is another object of the present invention to provide an internal voltage boosting circuit of the semiconductor memory device capable of enhancing the pumping efficiency regardless of the body effect thereof even when the boosted voltage level is increased.

To achieve the above objects, the voltage boosting circuit of the present invention includes a voltage converting circuit connected between an oscillator and a pair of pumping capacitors. The pair of pumping capacitors are then connected to a single transmission transistor, which outputs a boosted voltage that is derived from the combination of a precharge voltage placed on the source of the transmission transistor and the voltage stored on the pumping capacitors. The presence of the voltage converting circuit, which uses cross-connected PMOS transistors coupled to ground through a pair of NMOS transistors and establishes a differential amplifier, substantially eliminates the body effect problems that would otherwise occur.

In one embodiment, the voltage converting circuit is disposed between the oscillator and the pumping transistor that is connected to the gate of the transmission transistor. In this embodiment, control over the boosted voltage level is obtained by controlling the gate voltage to the transmission transistor.

In another embodiment, the voltage converting circuit is disposed between the oscillator and the pumping transistor that is connected to the source of the transmission transistor. In this embodiment, control over the boosted voltage level is obtained by controlling the source voltage to the transmission transistor.

In yet another embodiment, two voltage converting circuits are used. In this embodiment, the first voltage converting circuit is disposed between the oscillator and the pumping transistor that is connected to the source of the transmission transistor. The second voltage converting circuit is disposed between the oscillator and the pumping transistor that is connected to the gate of the transmission transistor. In this embodiment, control over the boosted voltage level is obtained by controlling both the source and gate voltages to the transmission transistor.

BRIEF DESCRIPTION OF THE DRAWINGS

In the detailed description of the preferred embodiments of the present invention presented below, reference is made to the accompanying drawings, in which.

DETAILED DESCRIPTION OF THE PREFERRED EMBODIMENT

Figure 1:
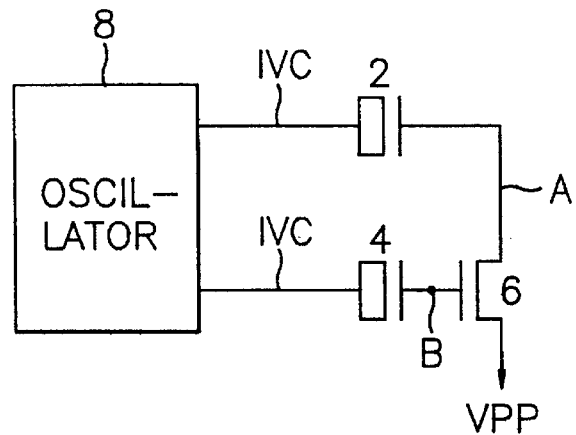
FIG. 1 is a diagram showing a conventional internal voltage boosting circuit.
Figure 2:
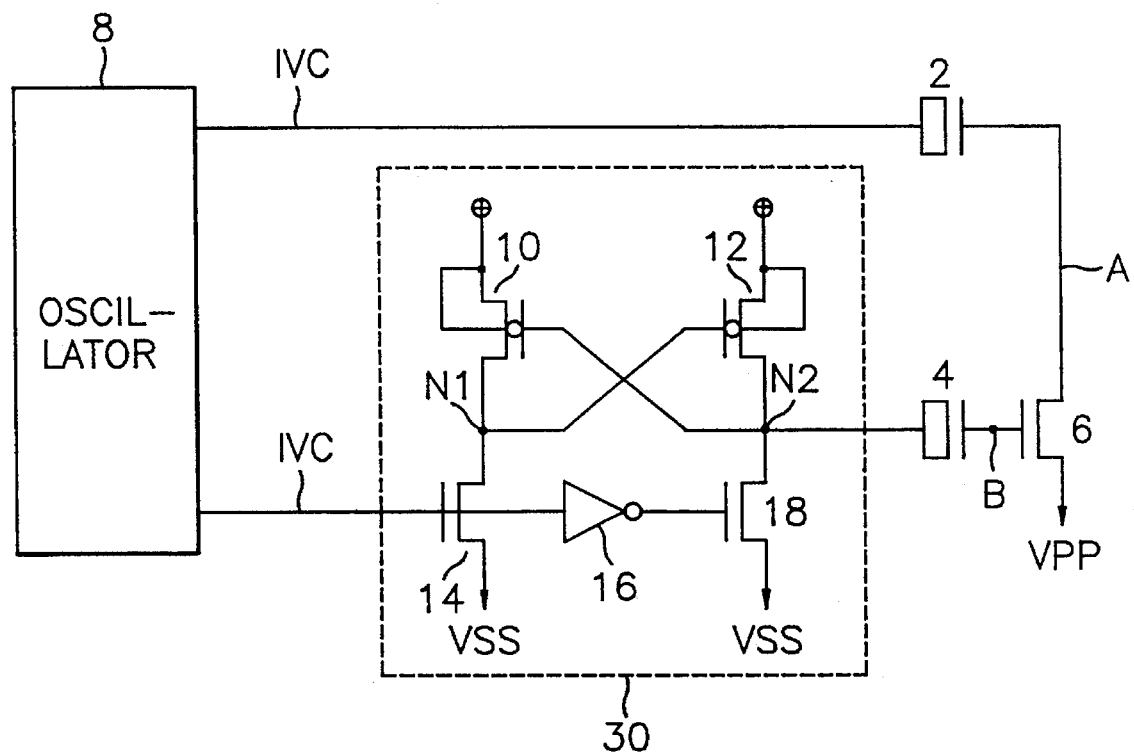
FIG. 2 is a diagram showing an internal voltage boosting circuit according to the present invention.

FIG. 2 shows an internal voltage boosting circuit according to the present invention. The internal voltage boosting circuit of FIG. 2 includes an oscillator 8 which outputs to first and second input nodes an output signal of internal voltage IVC level having a constant oscillating cycle. A boosting node outputs a boosted voltage VPP, and first and second pumping nodes A and B are precharged by a predetermined voltage. A first pumping capacitor 2 formed between the first input node and the first pumping node A pumps the first pumping node A in response to the output signal of internal voltage level applied through the first input node. A voltage converting circuit 30 converts the internal voltage IVC applied through the second input node into a power supply voltage level and a second pumping capacitor 4 formed between the voltage converting circuit 30 and the second pumping node B pumps the second pumping node B in response to the output of the voltage converting circuit 30. A transmission transistor 6 is also formed between the first pumping node A and the boosting node, the gate of which is controlled by the second pumping node B.

The voltage converting circuit 30 includes a PMOS transistor 10 connected between the power supply voltage VCC and a control node N1. An NMOS transistor 14 connected between the control node N1 and a ground voltage VSS receives the output signal of internal voltage IVC level from the oscillator 8 at its gate. A PMOS transistor 12 is connected between the power supply voltage VCC and an output node N2. NMOS transistor 18 is connected between the output node N2 and the ground voltage VSS, having its gate connected to the output of an inverter 16 that receives the output signal of the oscillator 8 through the NMOS transistor 14. The gate of the PMOS transistor 10 is connected to the output node N2 and the gate of PMOS transistor 12 to the control node N1. The cross-connected PMOS transistors 10 and 12 and the MOS transistors 14 and 18 have differential construction, and such a construction is typically referred to as a cascode voltage converting circuit.

If an internal voltage high enough to conduct the NMOS transistor 14 is input, the control node N1 is discharged to a logic "low" state, and the PMOS transistor 12 connected to the control node N1 is turned on. Then, the output node N2 is charged to the power supply voltage level. Thus, the gate voltage of the transmission transistor 6 is boosted to 2VCC level, and the voltage drop due to the threshold voltage Vth of the transmission transistor 6 can be removed. This makes it possible to transmit a large amount of charge to the boosting node.

Even when the circuit operates using a low power supply voltage, such as 2.8 V, the gate voltage of the transmission transistor 6 is set to 5.6 V and the gate-source voltage Vgs thereof becomes 2.3 V (VPP=3.5 V). Thus, the transmission transistor 6 is capable of transmitting a large amount of charge to the boosting node and the driving capability is enhanced.

The internal voltage boosting circuit of FIG. 2 can obtain a boosted voltage VPP having a desired voltage level by controlling the gate voltage of the transmission transistor 6.

Figure 3:
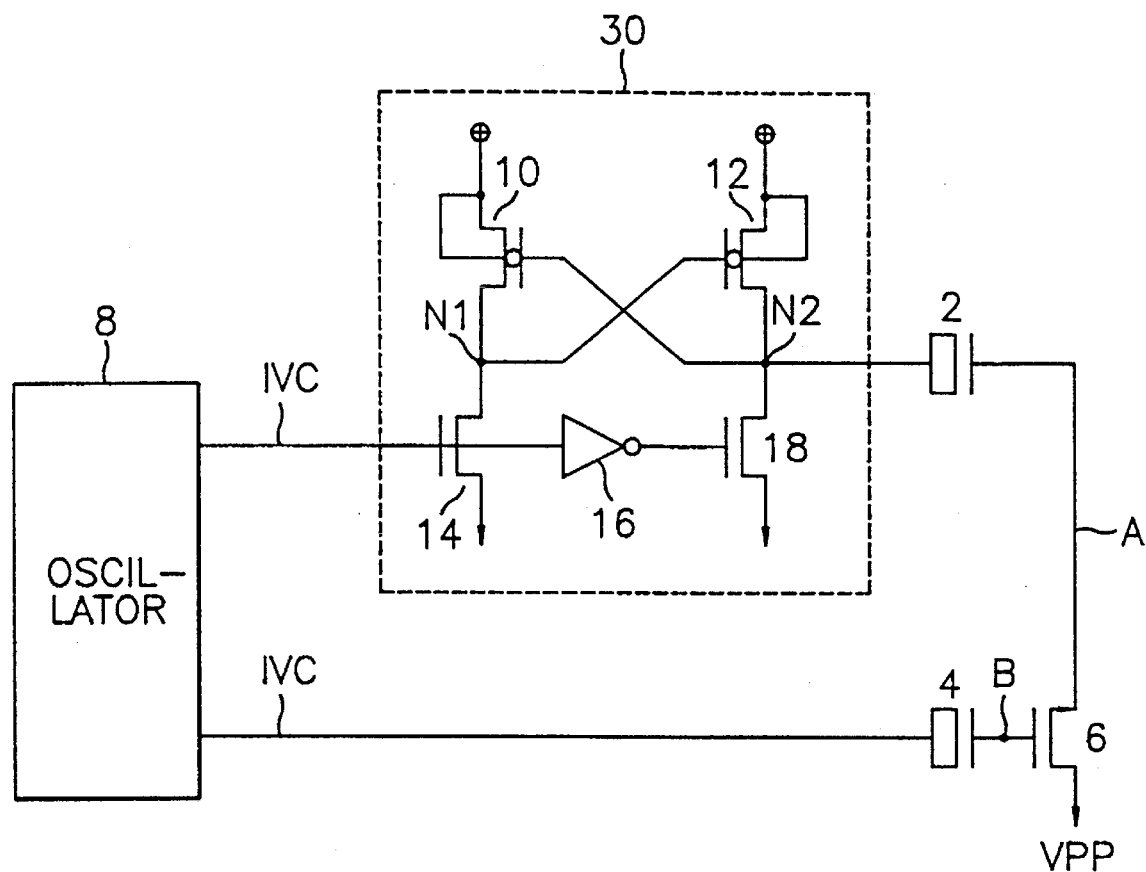
FIG. 3 is a diagram showing the internal voltage boosting circuit according to another preferred embodiment of the present invention.

FIG. 3 shows the internal voltage boosting circuit according to another preferred embodiment of the present invention. The internal voltage boosting circuit of FIG. 3 includes an oscillator 8 which outputs to first and second input nodes the output signal of internal voltage level having a constant oscillating cycle, a boosting node for outputting a boosted voltage and first and second pumping nodes A and B precharged by a predetermined voltage. A voltage converting circuit 30 converts the internal voltage applied through the first input node to the power supply voltage level. A first pumping capacitor 2 formed between the voltage converting circuit 30 and the first pumping node A pumps the first pumping node A in response to the output of the voltage converting circuit 30. A second pumping capacitor 4 formed between the second input node and the second pumping node B pumps the second pumping node B in response to the output signal of internal voltage level applied through the second input node. A transmission transistor 6 is also formed between the first pumping node and the boosting node, having its gate controlled by the second pumping node.

The voltage converting circuit 30 is constructed the same as the voltage converting circuit of FIG. 2, and, therefore, similar reference numerals have been used.

The operation of the boosting circuit of FIG. 3 is similar to that of FIG. 2, but the boosting circuit of FIG. 3 obtains the boosted voltage VPP of a desired voltage level by controlling the drain voltage of the transmission transistor 6, rather than the gate voltage as in the FIG. 2 embodiment.

Figure 4:
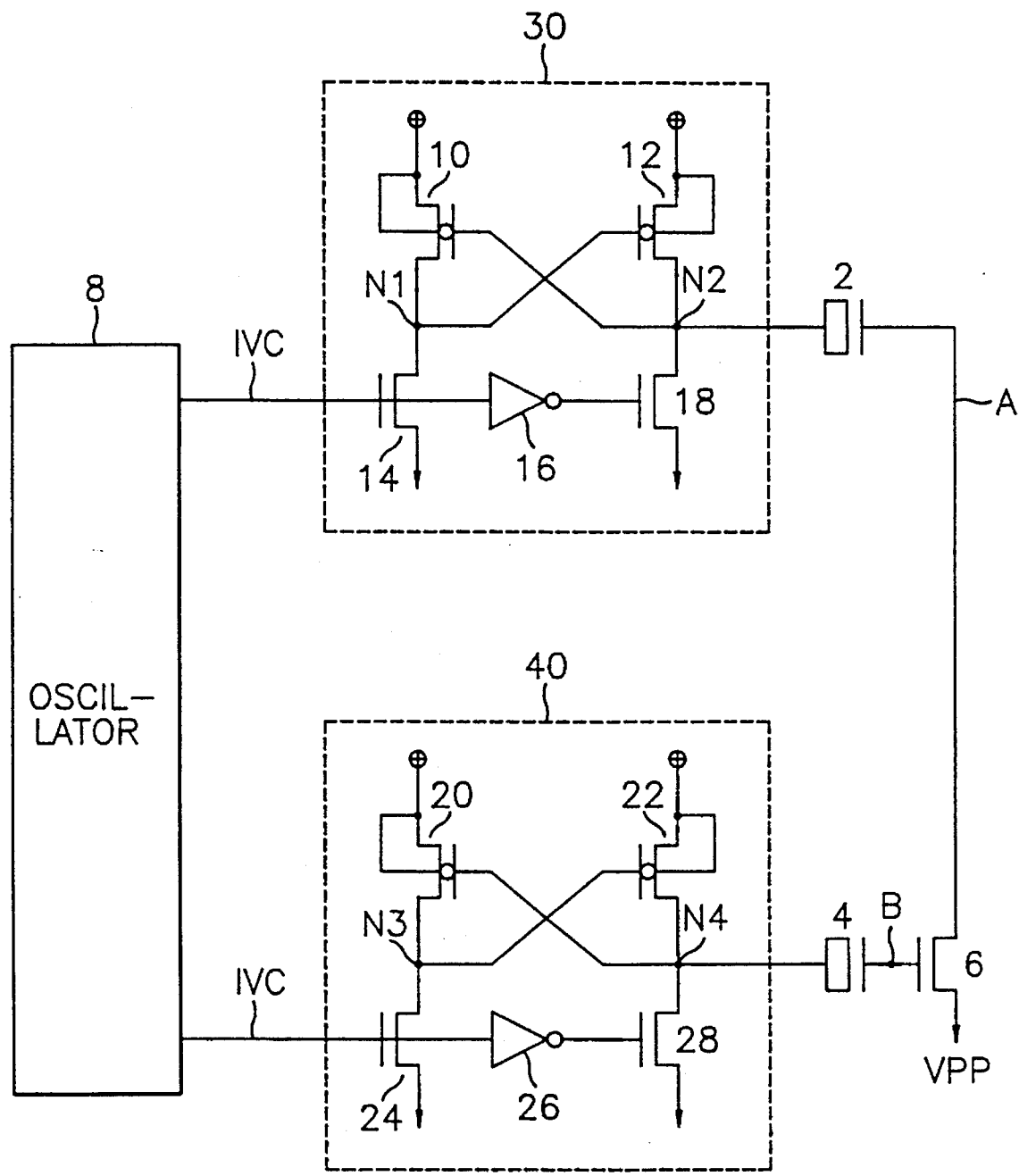
FIG. 4 is a diagram showing the internal voltage boosting circuit according to the third preferred embodiment of the present invention.

FIG. 4 shows the internal voltage boosting circuit according to a third preferred embodiment of the present invention.

The boosting circuit of FIG. 4 includes voltage converting circuits 30 and 40, one associated with each of the first and second pumping capacitors 2 and 4, which allows boosting the pumping voltage to twice of the power supply voltage VCC regardless of the low internal voltage.

The internal voltage boosting circuit of FIG. 4 includes an oscillator 8 which outputs to first and second input nodes the output signal of internal voltage level having a constant oscillating cycle, a boosting node for outputting a boosted voltage and first and second pumping nodes A and B precharged by a predetermined voltage. A first voltage converting circuit 30 converts the output signal of internal voltage level applied through the first input node into the power supply voltage level. A second voltage converting circuit 40 converts the output signal of internal voltage level applied through the second input node into the power supply voltage level. A first pumping capacitor 2 formed between the first voltage converting circuit 30 and the first pumping node A pumps the first pumping node A in response to the output of the first voltage converting circuit 30, while a second pumping capacitor 4 formed between the second voltage converting circuit 40 and the second pumping node B pumps the second pumping node B in response to the output of the second voltage converting circuit 40 transmission transistor 6 is also formed between the first pumping node A and the boosting node, the current of which is controlled by the second pumping node B. Each of the first and second voltage converting circuits 30 an 40 are constructed as previously described with reference to the voltage converting circuit 30 of FIG. 2, but since two different voltage converting circuits are included in this embodiment, the second such circuit is labelled differently, and contains transistors 20, 22, 24 and 28, as well as inverter 26, which are connected in the same manner as transistors 10, 12, 14 and 18, as well as inverter 16, described previously, As can be seen from such a construction, the boosting circuit of FIG. 4 can obtain the boosted voltage VPP of a desired voltage level by controlling both the gate and drain of the transmission transistor 6.

Figure 5:
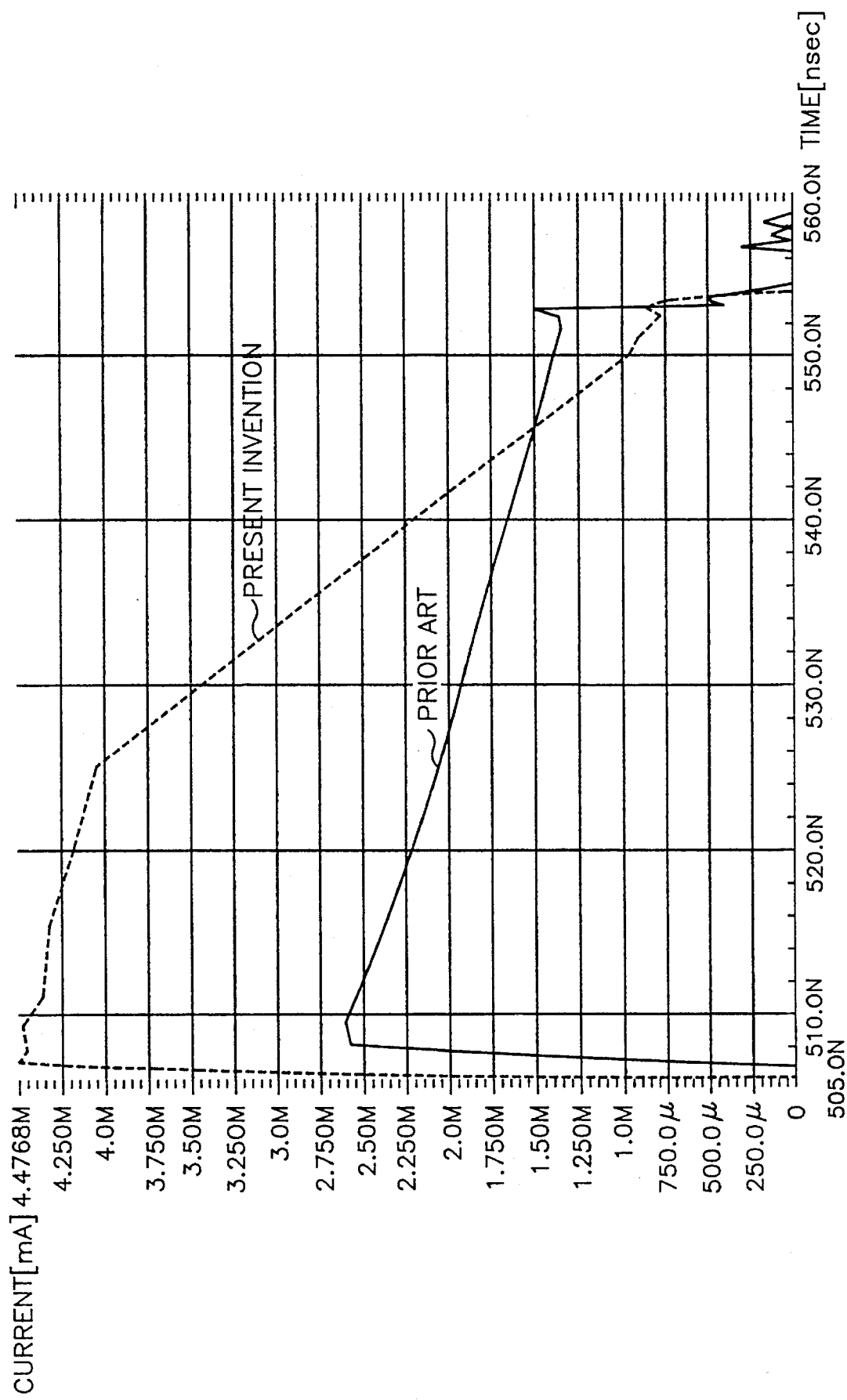
FIG. 5 is a waveform chart according to the prior art and present invention.

FIG. 5 is a waveform chart showing the results of a circuit simulation according to the prior art and the present invention. Under the condition that the cycle of the oscillator is 100 ns, the boosted voltage VPP is 3.75 V, and the internal voltage is 2 V, FIG. 5 shows the amount of current transmitted to the boosting node when the pumping node has be precharged with the power supply voltage of 2.8 V and is then pumped in response to the output signal of internal voltage level of the oscillator, using both the prior art and present invention. As can be seen from FIG. 5, the driving capability of the transmission transistor according to the present invention is enhanced as compared to the prior art.

As can be seen from the foregoing, the present invention of improves the pumping efficiency regardless of body effect problems even when the boosted voltage level is increased.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the present invention. For instance, it can be easily understood by those skilled in the art that instead of the cascode type voltage converting circuit, another circuit can also be employed to control the voltage at the gate or/and drain of the transmission transistor.

What is claimed is:

1. An internal voltage boosting circuit of a semiconductor memory device comprising:

voltage converting means which receives an internal voltage level signal for converting said internal voltage level signal to a power supply voltage level signal;

pumping means controlled by said power supply voltage level signal for pumping a pumping node above a predetermined precharge voltage level; and transmission means connected to said pumping node for outputting a voltage boosted above said predetermined precharge voltage level.

2. The internal voltage boosting circuit according to claim 1, wherein said internal voltage level signal has a constant oscillating cycle.

3. An internal voltage boosting circuit of a semiconductor memory device comprising:

an oscillator for outputting to first and second input nodes an internal voltage level signal having a constant oscillating cycle;

a boosting node for outputting a boosted voltage;

first and second pumping nodes precharged by a predetermined voltage;

a voltage converting circuit for converting said internal voltage level signal applied through said first input node into a power supply voltage level signal;

a first pumping capacitor, formed between said voltage converting circuit and said first pumping node, for pumping said first pumping node in response to said power supply voltage level signal;

a second pumping capacitor, formed between said second input node and said second pumping node, for pumping said second pumping node in response to said internal voltage level signal applied through said second input node; and an NMOS transistor having its channel connected between said first pumping node and said boosting node and its gate connected to said second pumping node which outputs a boosted voltage signal.

4. The internal voltage boosting circuit according to claim 3, wherein said voltage converting circuit comprises:

a first NMOS transistor for discharging a control node in response to said internal voltage level signal applied through said first input node;

a second NMOS transistor for discharging an output node in response to an inverted internal voltage level signal;

a first PMOS transistor, controlled by said control node, for charging said output node to said power supply voltage level; and a second PMOS transistor, controlled by said output node, for charging said control node to said power supply voltage level.

5. An internal voltage boosting circuit of a semiconductor memory device comprising:

an oscillator for outputting to first and second input nodes an internal voltage level signal having a constant oscillating cycle;

a boosting node for outputting a boosted voltage;

first and second pumping nodes precharged by a predetermined voltage;

a voltage converting circuit for converting said internal voltage level signal applied through said second input node into a power supply voltage level signal;

a first pumping capacitor, formed between said first input node and said first pumping node, for pumping said first pumping node in response to said internal voltage level signal applied through said first input node;

a second pumping capacitor, formed between said voltage converting circuit and said second pumping node, for pumping said second pumping node in response to said power supply voltage level signal; and an NMOS transistor having its channel connected between said first pumping node and said boosting node and its gate connected to said second pumping node which outputs a boosted voltage signal.

6. The internal voltage boosting circuit according to claim 5, wherein said voltage converting circuit comprises:

a first NMOS transistor for discharging a control node in response to said internal voltage level signal applied through said first input node;

a second NMOS transistor for discharging an output node in response to an inverted internal voltage level signal;

a first PMOS transistor, controlled by said control node, for charging said output node to said power supply voltage level; and a second PMOS transistor, controlled by said output node, for charging said control node to said power supply voltage level.

7. An internal voltage boosting circuit of a semiconductor memory device comprising:

an oscillator for outputting to first and second input nodes an internal voltage level signal having a constant oscillating cycle;

a boosting node for outputting a boosted voltage;

first and second pumping nodes precharged by a predetermined voltage;

a first voltage converting circuit for converting said internal voltage level signal applied through said first input node to a first output signal which has a power supply voltage level;

a second voltage converting circuit for converting said internal voltage level signal applied through said second input node to a second output which has said power supply voltage level;

a first pumping capacitor, formed between said first voltage converting circuit and said first pumping node, for pumping said first pumping node in response to said first output;

a second pumping capacitor, formed between said second voltage converting circuit and said second pumping node, for pumping said second pumping node in response to said second output; and an NMOS transistor having its channel connected between said first pumping node and said boosting node and its gate connected to said second pumping node which outputs a boosted voltage signal.

8. The internal voltage boosting circuit according to claim 5, wherein said first voltage converting circuit comprises:

a first NMOS transistor for discharging a first control node in response to said internal voltage level signal applied through said first input node;

a second NMOS transistor for discharging a first output node in response to an inverted internal voltage level signal;

a first PMOS transistor controlled by said first control node, for charging said first output node to said power supply voltage level; and a second PMOS transistor controlled by said first output node, for charging said first control node to said power supply voltage level, and said second voltage converting circuit comprises a third NMOS transistor for discharging a second control node in response to said internal voltage level signal applied through said second input node;

a fourth NMOS transistor for inverting said internal voltage level signal to discharge a second output node;

a third PMOS transistor controlled by said second control node, for charging said second output node to said power supply voltage level; and a fourth PMOS transistor controlled by said second output node, for charging said second control node to said power supply voltage level.

\* \* \* \* \*